(12) United States Patent
Lam (10) Patent No.: US 9,838,076 B2
(45) Date of Patent: Dec. 5, 2017

(54) HANDLER WITH INTEGRATED RECEIVER AND SIGNAL PATH INTERFACE TO TESTER

(71) Applicant: Advantest Corporation, Tokyo (JP)

(72) Inventor: Daniel Lam, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 15/077,805

(22) Filed: Mar. 22, 2016

(65) Prior Publication Data

US 2017/0279491 A1   Sep. 28, 2017

(51) Int. Cl.
  H04B 17/00   (2015.01)
  H04B 3/46    (2015.01)
  H04B 3/52    (2006.01)
  H04B 17/12   (2015.01)

(52) U.S. Cl.
  CPC .......... H04B 3/46 (2013.01); H04B 3/52 (2013.01); H04B 17/12 (2015.01)

(58) Field of Classification Search
  USPC ......... 455/67.11, 67.13, 67.15, 67.12, 550.1, 455/575.7
  See application file for complete search history.

(56) References Cited

U.S. PATENT DOCUMENTS

| | | | |
|---|---|---|---|
| 5,102,352 A | 4/1992 | Arisaka | |
| 5,181,025 A * | 1/1993 | Ferguson | G08C 19/28 340/870.21 |
| 5,708,296 A | 1/1998 | Bhansali | |
| 8,600,309 B2 | 12/2013 | Chang et al. | |
| 9,310,422 B2 | 4/2016 | Nath et al. | |
| 9,490,540 B1 | 11/2016 | Davies et al. | |
| 9,588,173 B2 | 3/2017 | Isaac et al. | |
| 2008/0048639 A1 | 2/2008 | Sutono et al. | |
| 2009/0153158 A1* | 6/2009 | Dunn | G01R 31/2822 324/762.01 |
| 2012/0268153 A1* | 10/2012 | Nickel | G01R 31/3025 324/754.31 |
| 2013/0200912 A1 | 8/2013 | Panagas | |
| 2013/0200915 A1 | 8/2013 | Panagas | |
| 2013/0200917 A1 | 8/2013 | Panagas | |
| 2014/0111239 A1 | 4/2014 | Blair et al. | |
| 2014/0285277 A1 | 9/2014 | Herbsommer et al. | |
| 2016/0025788 A1* | 1/2016 | Fujita | G01R 29/105 343/703 |
| 2016/0276996 A1* | 9/2016 | Tze-Meng | H03H 1/0007 |
| 2016/0356842 A1 | 12/2016 | Lee | |

* cited by examiner

Primary Examiner — Fayyaz Alam (57) ABSTRACT

A method for testing a device under test (DUT) is disclosed. The method comprises communicating signals wirelessly from a first plurality of patch antennae disposed on a top surface of the DUT to a second plurality of patch antennae disposed on a printed circuited within a handler device, wherein the handler device is operable to place the DUT in a socket of a tester system, and wherein the tester system comprises the handler device and a test fixture. The method further comprises communicating the signals captured by the second plurality of patch antennae using microstrip transmission lines to a patch antenna on the printed circuit board, wherein a first waveguide is mounted to the patch antenna using a first waveguide flange, and wherein the first waveguide flange is coupled to a first end of the first waveguide.

20 Claims, 8 Drawing Sheets

HANDLER WITH INTEGRATED RECEIVER AND SIGNAL PATH INTERFACE TO TESTER

FIELD OF THE INVENTION

Embodiments of the present disclosure generally relate to Automatic Test Equipment (ATE) for testing electronic components.

BACKGROUND

Automatic Test Equipment (ATE) is commonly used within the field of electronic chip manufacturing for the purposes of testing electronic components. ATE systems both reduce the amount of time spent on testing devices to ensure that the device functions as designed and serve as a diagnostic tool to determine the presence of faulty components within a given device before it reaches the consumer.

ATE systems can perform a number of test functions on a device under test (DUT) through the use of test signals transmitted to and from the DUT. Conventional ATE systems are very complex electronic systems and generally include printed circuit boards (PCB), coax cables and waveguides to extend the signal path of test signals transmitted from the DUT to a tester diagnostic system during a test session. Conventional ATE systems are better suited to capturing and extracting signals physically and transmitting them to a tester using, for example, microstrip transmission lines disposed on the surface of a printed circuit board (PCB), a coax cable or a waveguide.

The advent of high frequency wireless applications e.g., WiGig applications, however, requires the testing of DUTs that communicate wirelessly at multi-gigabit speeds, which is problematic for conventional ATE systems. WiGig enabled devices, for example, operate in the 2.4, 5 and 60 GHz bands and can deliver data wirelessly at rates up to 7 Gbits/s. The WiGig chips under test (or WiGig DUTs) can comprise microwave elements, e.g. patch antenna mounted on the bottom and top of the device. Typically, the DUT is moved during testing by a handler device, which secures the DUT via suction and physically places the DUT at the tester station. For a wireless application, the handler may, for example, move the DUT in close proximity and wireless connectivity with receivers on the test fixture.

For the patch antennae located at the bottom of the DUT (or WiGig chip), the receivers located on the test fixture can readily come into wireless signal reception with the patch antennae for testing thereof, e.g., for microwave signal testing. However, when the DUT contains patch antennae located at the top, this is problematic for testing because the receivers located at the test fixture may not be able to receive the signals for testing for any one of several reasons. For example, the receivers may be too far away from the DUT, the top patch antennae may be radiating wireless signals in a direction opposite from the receivers on the test fixture, or the handler electronics may be interfering with the signal reception.

SUMMARY OF THE INVENTION

Accordingly, a need exists for an apparatus and/or method that can address the problems with the approaches described above. Using the beneficial aspects of the apparatus and/or method described, without their respective limitations, embodiments of the present disclosure provide a novel solution to address these problems.

Embodiments of the present invention place receivers and waveguides directly into the handler device that can receive and channel signals from any patch antennae located on the top of the DUT directly to the bottom of the handler (or bottom side of the DUT). Subsequently, waveguides located on the test fixture can interface with the bottom of the handler device to transmit the signals from the handler to the test fixture for testing thereof. In this way, embodiments of the present invention advantageously allow DUTs operating in the microwave bandwidth (e.g., 60 GHz range) and with patch antennae located on either side of the DUTs to be tested readily utilizing a test fixture.

In one embodiment, a method for testing a device under test (DUT) is disclosed. The method comprises communicating signals wirelessly from a first plurality of patch antennae disposed on a top surface of the DUT to a second plurality of patch antennae disposed on a printed circuited within a handler device, wherein the handler device is operable to place the DUT in a socket of a tester system, and wherein the tester system comprises the handler device and a test fixture. The method further comprises communicating the signals captured by the second plurality of patch antennae using microstrip transmission lines to a patch antenna on the printed circuit board, wherein a first waveguide is mounted to the patch antenna using a first waveguide flange, and wherein the first waveguide flange is coupled to a first end of the first waveguide.

In another embodiment, a tester system for testing a device under test (DUT) is disclosed. The system comprises a handler device operable to place the DUT in a socket. The system also comprises a test fixture operable to receive test signals from the DUT. Further, the system comprises a first plurality of patch antennae disposed on the top surface of the DUT operable to transmit signals wirelessly to a second plurality of patch antennae disposed on a printed circuit board within the handler device. The printed circuit board comprises microstrip transmission lines and operable to communicate the signals to a patch antenna using the microstrip transmission lines. Finally, the system comprises a first waveguide mounted to the patch antenna wherein the signals are translated to the test fixture using the first waveguide.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

As explained above, conventional ATE systems are not well adapted to address the problem of capturing and testing wireless signals transmitted by DUTs with patch antennae located on both sides of the DUT e.g., WiGig chips. Specifically, when the DUTs contain patch antennae located at the top of the DUT, testing is problematic because the receivers located at the testing fixture may not be able to receive the test signals. For example, the receivers may be too far away from the top of the DUT, the top patch antennae may be radiating wireless signals in a direction opposite from the receivers that the receivers are unable to capture, or the handler electronics may be interfering with the signal reception.

Embodiments of the present invention place receivers and waveguides directly into the handler device that can receive and channel signals from any patch antennae located on the top of the DUT directly to the bottom of the handler (or bottom side of the DUT). Subsequently, waveguides located on the test fixture can interface with the bottom of the handler device to transmit the signals from the handler to the test fixture for testing thereof. In this way, embodiments of the present invention advantageously allow DUTs operating in the microwave bandwidth (e.g., 60 GHz range) and with patch antennae located on either side of the DUTs to be tested readily utilizing a test fixture.

Figure 1:
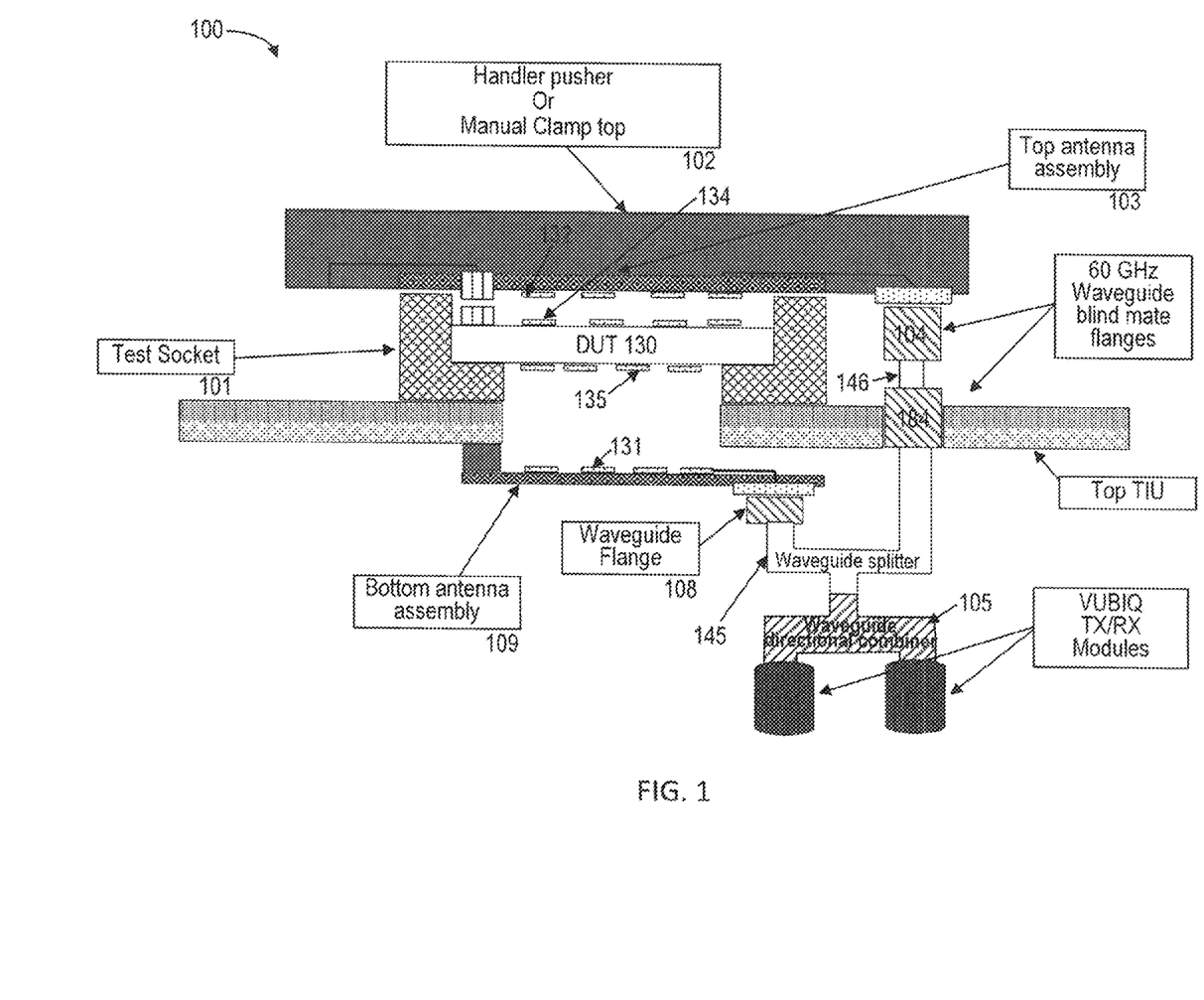
FIG. 1 is a block diagram of an exemplary tester system to test semiconductor chips in accordance with an embodiment of the present invention.

FIG. 1 is a block diagram of an exemplary tester system to test semiconductor chips in accordance with an embodiment of the present invention. Tester system 100 comprises a handler (or manual clamp top) 102 that that is used to move the DUT device. The handler 102 can also be used to secure the DUT via suction (or otherwise) in the socket 101. The text fixture, in one embodiment, may comprise an interface test adapter (ITA) (not shown), a device for making electronic connections between the ATE and the DUT. The ITA may also contain additional circuitry to adapt signals between the ATE and the DUT and can have physical facilities to mount the DUT. Finally, a socket 101 can be used to bridge the connection between the ITA and the DUT. Typically, the DUT is moved during testing by the handler device, which secures the DUT via suction and physically places the DUT into the socket within the test fixture. The handler 102 is then typically folded down on top of the test fixture in order to hold the DUT in place as shown in FIG. 1.

As discussed above, DUT 130 can have microwave elements, e.g., patch antennae or transceiver devices, mounted on the bottom (e.g., antennae 135) and on the top of the device (e.g., antennae 134). When the DUT 130 has patch antennae 135 located near the bottom of the DUT, the receiver patch antennae 131 located on the bottom antenna assembly 109 of the test fixture can readily capture the signals for testing, e.g., for microwave or Wi-Gig signal testing. In one embodiment, the bottom antenna assembly 109 can comprise a printed circuit board 122 comprising microstrip transmission lines or traces that can carry the signals received at patch antennae 131 to waveguide flange 108. Waveguide flange 108 is mounted over a patch antenna on the printed circuit board for the bottom antenna assembly 109. The patch antenna, over which the waveguide flange is mounted, transmits the signal from the receiving antennae 131 to waveguide splitter 145. The signal is then conveyed to a waveguide directional combiner 105, and subsequently redirected to transmit and receive modules, 106 and 107. In one embodiment, flange 108 is connected directly to the test fixture using a single waveguide (instead of a waveguide splitter).

As mentioned above, if the DUT has patch antennae located on the bottom of the DUT 135, the receivers 131 located within test fixture and in close proximity to the DUT can receive the wireless transmissions from the patch antennae easily for testing. However, when the DUTs (e.g. WiGig chips) contain patch antennae located at the top of the DUT, testing is more problematic because the receivers located within the test fixture e.g., receiver antennae 131 may not be within the line of sight of the wireless transmissions from the top of the DUT or the handler/test head 102 may be blocking off the signals from the DUT. It should be noted that the patch antennae located on DUT 130 can be bi-directional and can both transmit and receive wireless signals. Accordingly, conventional testers would not be able to either receive or transmit signals to transceivers located on the top surface of the DUT.

Embodiments of the present invention overcome the problem by placing transmitters and receivers (or transceivers), e.g., patch antennae 132 within the handler itself. In one embodiment, for example, as shown in FIG. 1, handler 102 can comprise a top antenna assembly 103 comprising multiple transceiver patch antennae 132. The transceivers 132 can transmit the wireless signals (e.g., microwave signals) captured from the patch antennae 134 to a waveguide flange 104 via traces or microstrip transmission lines on a printed circuit board. In one embodiment, waveguide flange 104 is mounted directly on a patch antenna that is connected to the receiving patch antennae 132 via traces on the printed circuit board. In one embodiment, waveguide 146 blind mates to waveguide 145, for example, using waveguide blind mate flanges, e.g., flange 184. In other words, a waveguide coupled to the handler 102 can be blind mated to a waveguide coupled to the test fixture, thereby, allowing signals to be communicated between the handler device and the test fixture.

Embodiments of the present invention use waveguides for capturing signals from the antennae 132 within the handler and channeling the signals from the patch antennae to the test fixture. For example, waveguide flange 104 is used to connect waveguide 146 to the handler 102 and waveguide 146 is used to convey signals from the handler directly to the bottom of the handler (or bottom side of DUT), and then interface with waveguides located on the test fixture for testing thereof. Further, waveguide 146 is connected (or blind mated) to waveguide splitter 145 located on the testing fixture using waveguide flange 184. The signal is then conveyed from waveguide splitter to a waveguide directional combiner 105, and subsequently redirected to transmit and receive modules, 106 and 107. It should be noted that in one embodiment signals can flow bi-directionally for testing purposes. In other words, signals may be transmitted or received by patch antennae 131 and 132. Accordingly, test fixture comprises both transmit and receive modules 106 and 107.

In one embodiment, the waveguide that connects to the handler device, e.g., waveguide 146 can blind mate with a waveguide located on the test fixture e.g., waveguide 145 using blind mate flanges in order to interface the signal to the test fixture. The flanges 104 and 184 can be 60 GHz blind mate flanges that allow waveguide 146 to be blind mated to one or more waveguides connected to the test fixture. In one embodiment, one side of the waveguide interface is allowed to float while the other side is fixed or static to allow proper registration between the handler and the fixture. The static end acts as a reference for the floating side when the two interfaces mate during testing.

Embodiments of the present invention, therefore, advantageously allow a signal path to be created in the handler itself to transfer the signal from the top of the DUT to the bottom of the DUT, or to the fixture, for testing. Conventional testers by comparison did not include signal paths within the handler for carrying signals. For example, conventional handlers did not include patch antennae, e.g., transceivers 132 to capture signals radiated by antennae on the top of a DUT or to radiate signals to the antennae on top of the DUT. Further, conventional tester handlers did not include any printed circuit boards for conveying any wireless or other signals captured from a DUT either. In other words, in conventional testers, the handlers were not electrically coupled to the test fixture in any way, the handlers were simply used at robotic arms to move and hold the DUT in place.

Using embodiments of the present invention, DUTs comprising patch antennae on top can readily be tested by a test fixture. The handler of the tester system 100, for example, in one embodiment, comprises a printed circuit board, wherein the printed circuit board comprises patch antennae 132 that can act as receivers to capture the wireless signals from DUT 130. Patch antennae 132, in one embodiment, can also act as transmitters of wireless signals to the DUT.

In one embodiment, the captured signals from the DUT 130 can be transported over traces on the printed circuit board to another patch antenna coupled with a waveguide flange, e.g., flange 104. The flange 104 couples to a waveguide 146, which blind mates with another waveguide located on the test fixture to interface the signal to the tester system. Accordingly, embodiments of the present invention advantageously implement a method of capturing top-radiated wireless signals from a DUT using a handler structure and subsequently translating the signals down to the test fixture via a waveguide structure. Further, embodiments of the present invention also advantageously allow test signals to be transported from the test fixture to the handler via the same mechanism.

In one embodiment, the printed circuit board can comprise multiple patch antennae, each coupled to a respective waveguide, that are used to transmit signals from the handler to the test fixture. In one embodiment, each of the waveguides can be associated with a waveguide assembly, wherein each of the waveguides can be mounted on to a respective patch antenna on the printed circuit board within the handler. In this embodiment, each waveguide in the waveguide assembly is connected to the test fixture using a blind-mate connection as described above.

Figure 2A:
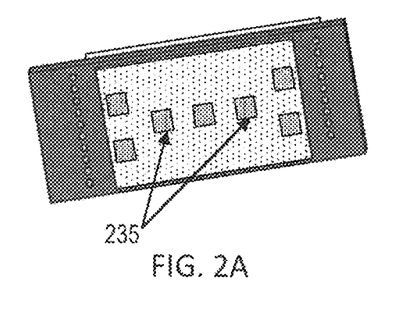
FIG. 2A is an exemplary perspective view of a DUT with patch antennae at the bottom.

FIG. 2A is an exemplary perspective view of a DUT with patch antennae at the bottom. As shown in FIG. 2A, traditionally most DUTs have patch antennae 235 located at the bottom of the DUT. The transceivers at the bottom of the DUT can be easily tested by designing the test fixture so that the receivers on the test fixture are within close proximity of the DUT when it is placed into the socket.

Figure 2B:
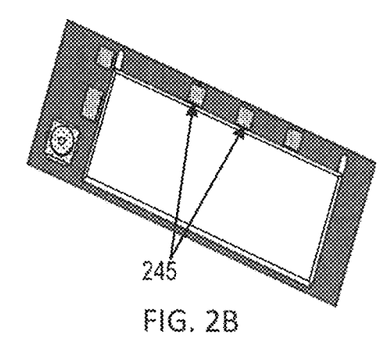
FIG. 2B is an exemplary perspective view of a DUT with patch antennae at the top of the DUT in accordance with an embodiment of the invention.

FIG. 2B is an exemplary perspective view of a DUT with patch antennae at the top of the DUT. As discussed above, traditionally, handlers are not electrically coupled to the test fixture in any way. With the advent of Wi-Gig and other applications in the microwave waveband, DUTs used in such applications can comprise patch antennae 245 on the top surface, as shown in FIG. 2B.

Figure 2C:
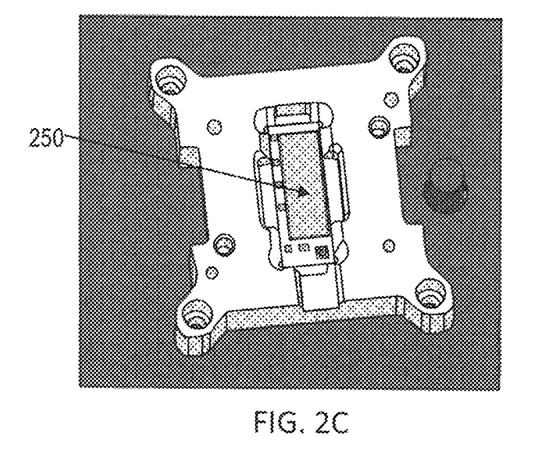
FIG. 2C is an exemplary perspective view of a DUT with top-radiating elements placed inside a socket in accordance with an embodiment of the present invention.

FIG. 2C is an exemplary perspective view of a DUT with top-radiating elements placed inside a socket in accordance with an embodiment of the present invention. As shown in FIG. 2C, DUT 250 is placed within socket 252 and comprises antennae on the top surface of the DUT that radiate wireless signals in the direction of a handler above the DUT. Embodiments of the present invention include hardware in the handler to translate signals from the handler to the test fixture so that top radiated signals from DUTs can be captured and redirected for testing purposes. Also, embodiments of the present invention allow test signals from the test fixture to be communicated to the patch antennae on top of the DUT via the hardware in the handler.

Figure 3:
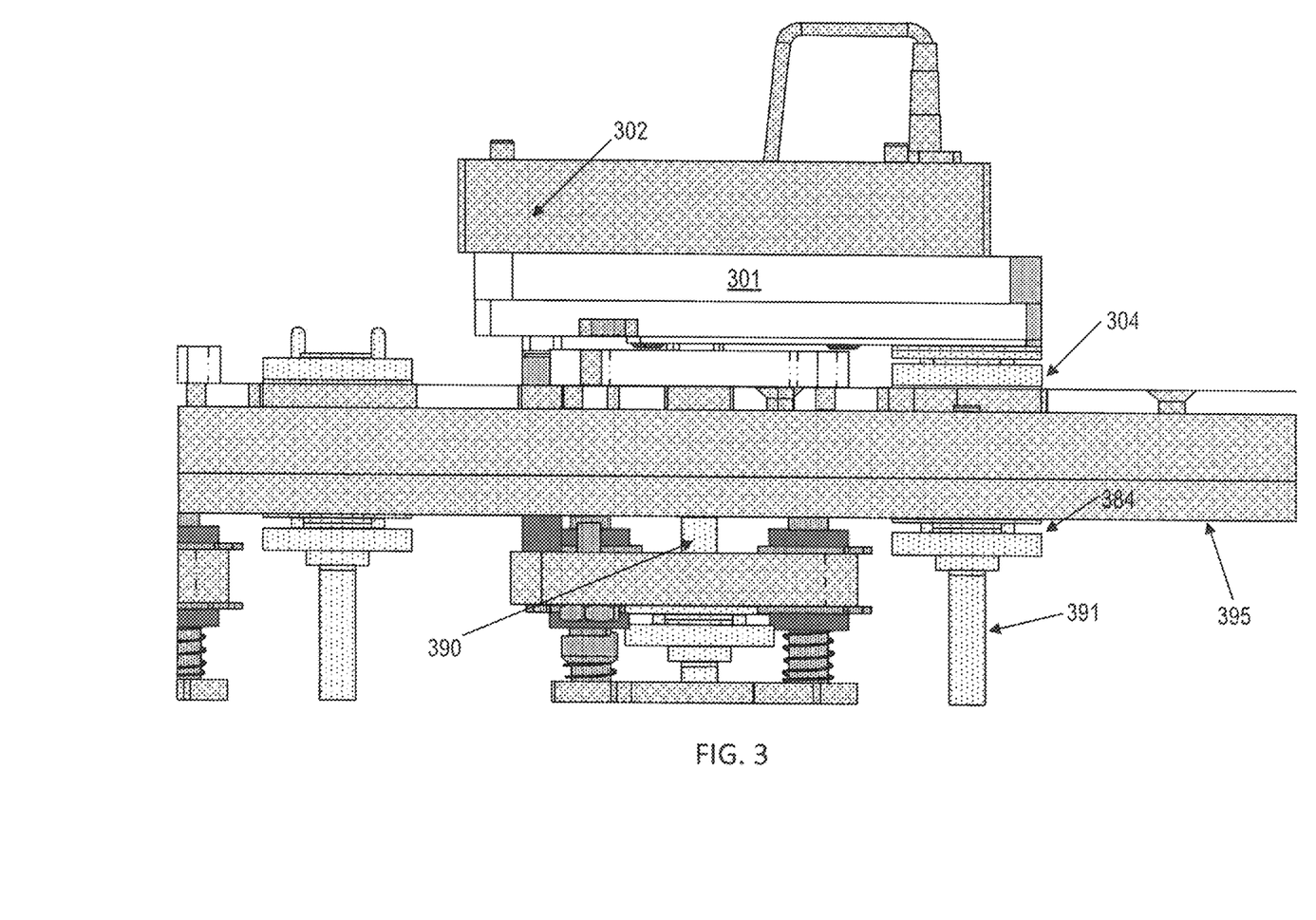
FIG. 3 illustrates a handler with integrated receiver and signal path interface to tester in accordance with an embodiment of the present invention.

FIG. 3 illustrates a handler with integrated receiver and signal path interface to tester in accordance with an embodiment of the present invention. As shown in FIG. 3, handler 302 is used to move the DUT (not shown) in socket 301 and to hold it in place using suction while the DUT is being tested. The handler comprises the top antenna assembly 103 (as shown in FIG. 1) which can comprise a printed circuit board that communicates signals from patch antennae receivers to a patch antenna on the printed circuit board connected to waveguide flange 303. The waveguide flange 303 is used to couple to the handler device while waveguide flange 384 is used to blind-mate the waveguide connected to the handler to the waveguide 391 connected to the test fixture.

In the embodiment shown in FIG. 3, the signal is further conveyed to other components of the test fixture using waveguide 391. In one embodiment, the antennae on the bottom of the DUT can radiate wireless signals into or receive wireless signals from a horn antenna 390 (also known as a microwave horn), which comprises a metal waveguide shaped like a horn to direct radio waves in a beam. The signals captured by the horn can be communicated to other components in the test fixture using regular waveguides.

Figure 4:
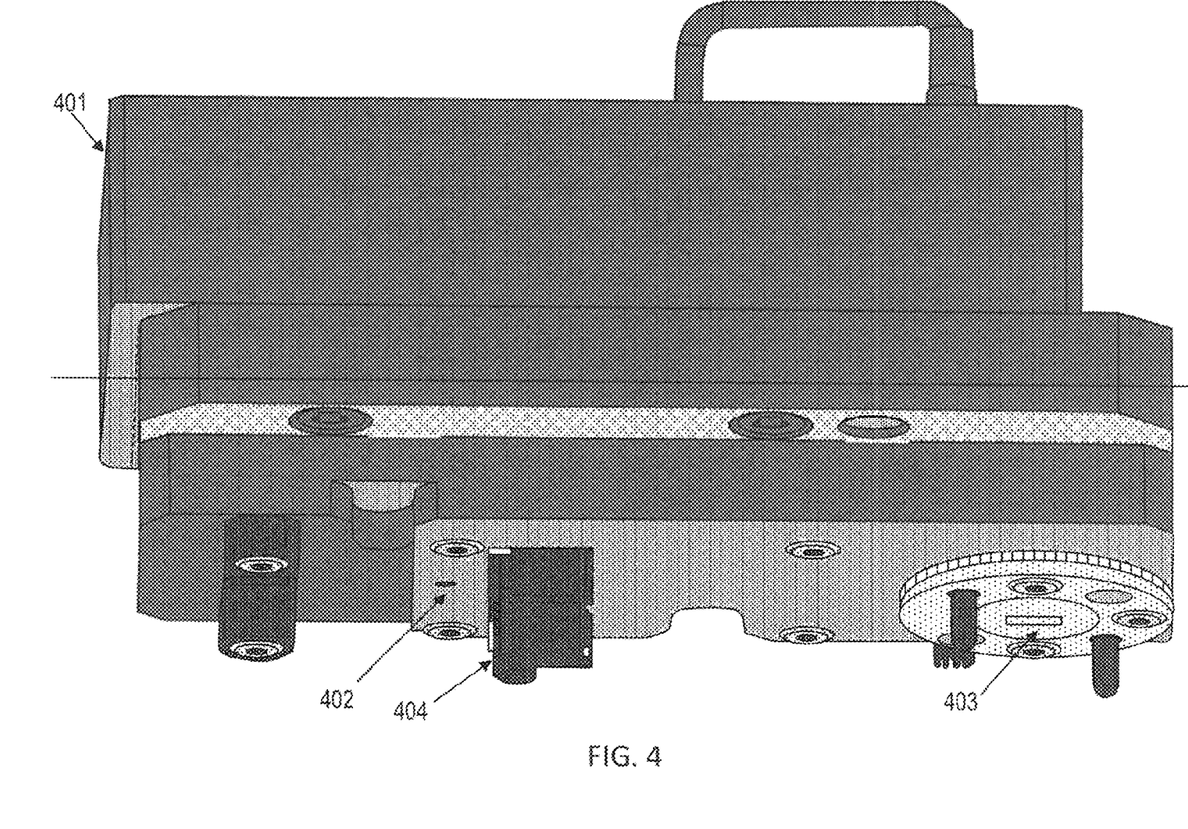
FIG. 4 illustrates a handler comprising a top antenna assembly with a printed circuit board in accordance with an embodiment of the present invention.

FIG. 4 illustrates a handler comprising a top antenna assembly with a printed circuit board in accordance with an embodiment of the present invention. As shown in FIG. 4, the top antenna assembly of handler 401 comprises printed circuit board 402 (also known as a load board). Load board 402 comprises a vacuum pickup that is used to move the DUT via suction.

In one embodiment, wireless signals radiated by the top facing antenna on the DUT are received by the patch antennae on printed circuit board 402. Similarly, in one embodiment, wireless signals radiated from the patch antennae on printed circuit board 402 are received by the DUT. The signals received by the patch antennae receivers on the load board are carried using traces or microstrip transmission lines to a patch antenna on the printed circuited board on which a flange 403 is mounted. Similarly, signals to be carried to the DUT will be conveyed from the patch antenna underneath flange 403 to the patch antennae on the load board directly above the DUT. As will discussed further in FIG. 5, flange 403 acts as an adapter that adapts a waveguide aperture to a patch antenna on the load board 402. Flange 403 is part of the waveguide connected to the handler, which blind mates with another waveguide connected to the test fixture, thereby, electrically coupling handler 401 with the test fixture.

Figure 5:
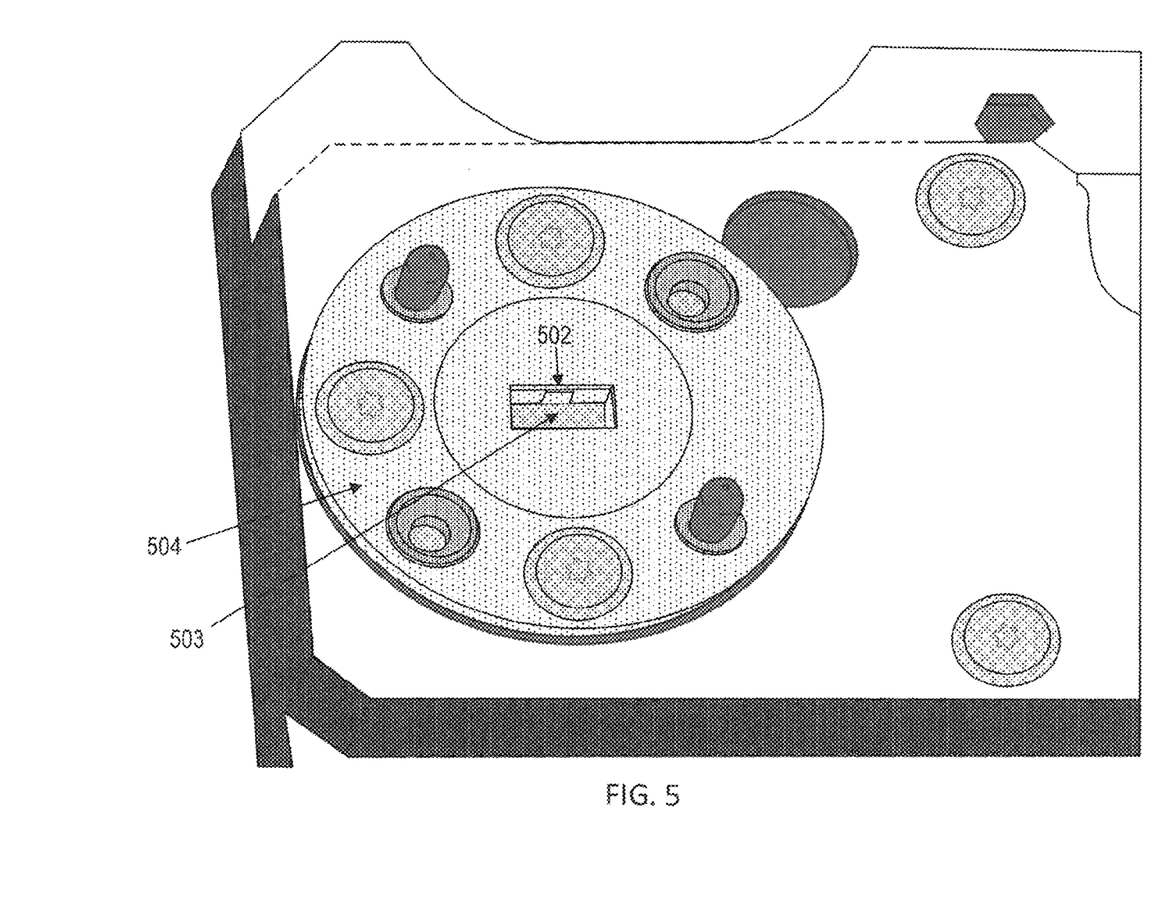
FIG. 5 illustrates a flange that adapts a waveguide aperture to a patch antenna on a printed circuit board in accordance with an embodiment of the present invention.

FIG. 5 illustrates a flange that adapts a waveguide aperture to a patch antenna on a printed circuit board in accordance with an embodiment of the present invention. Flange 504 comprises a waveguide aperture 502 that aligns with patch antenna 503. Flange 504, affixed to the handler is used to mount a waveguide directly on the patch antenna 502. Signals to and from the DUT are communicated through patch antenna 503 and the waveguide mounted on the patch antenna using flange 504.

Figure 6:
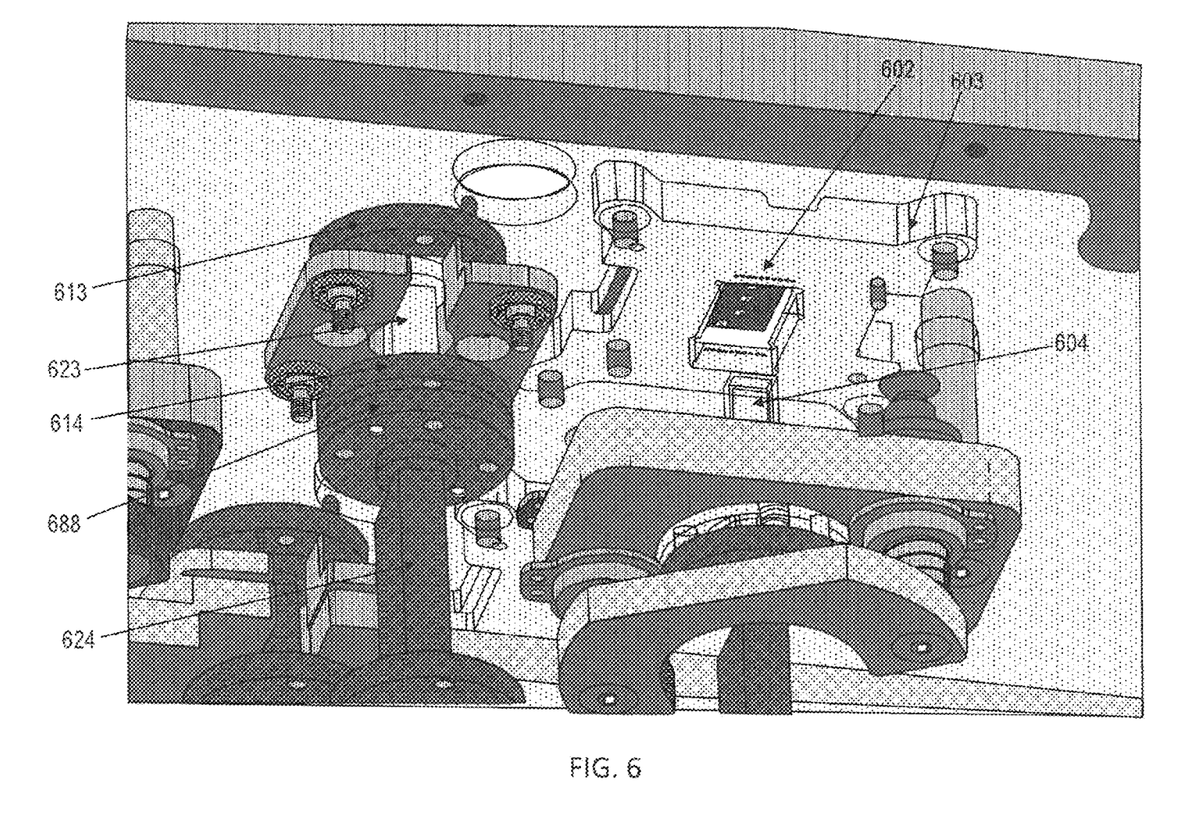
FIG. 6 illustrates a bottom perspective view of a waveguide on the handler device blind mating to a waveguide on the tester in accordance with an embodiment of the present invention.

FIG. 6 illustrates a bottom perspective view of a waveguide on the handler device blind mating to a waveguide on the tester in accordance with an embodiment of the present invention. As shown in FIG. 6, DUT 602 placed in socket 603 comprises patch antennae at the bottom of the DUT that radiate out to a horn 604 (as discussed in relation to FIG. 3 above). FIG. 6 also shows flange 613 affixed to the handler device, wherein the flange 613 is mounted on a patch antenna located on a load board within the handler device. Flange 613 is part of a waveguide 623 that blind mates with waveguide 624. Flange 614 of the waveguide connected to the handler blind mates with flange 688 of the waveguide connected to the test fixture.

Blind mating flange 614 to flange 688 allows the waveguide 623 to connect to waveguide 624 and allow the signal to pass from the handler to the test fixture. As mentioned above, in one embodiment, one side of the waveguide interface is allowed to float while the other side is fixed to allow proper registration between the handler and the fixture.

Figure 7:
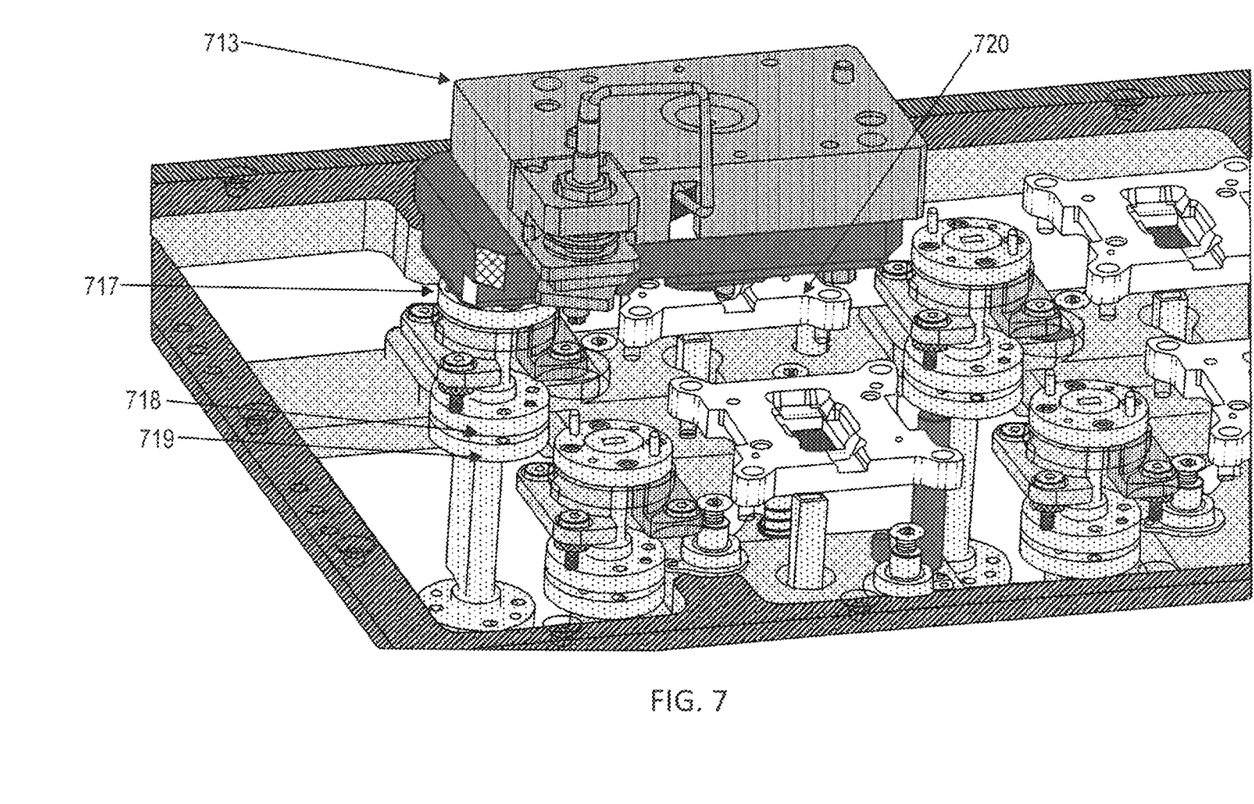
FIG. 7 illustrates a top perspective view of a handler with integrated receiver and signal path interface to tester in accordance with an embodiment of the present invention.

FIG. 7 illustrates a top perspective view of a handler with integrated receiver and signal path interface to tester in accordance with an embodiment of the present invention. Handler 713, as shown in FIG. 7, is used to hold the DUT (not shown) within socket 720 in place during testing. Signals can be transmitted to the patch antennae on top of the DUT from the test fixture through flange 717. Flange 717 is mounted on top of a patch antenna on a load board that transmits the signals to the DUT using traces on the load broad. Flange 718 is blind mated to flange 719, thereby, allowing a waveguide connected to the handler to interface with a waveguide located on the test fixture. Signals from the test fixture can either be transmitted upwards from the test fixture to the top antennae on a DUT in this way, or signals can be transmitted from the DUT downwards to the test fixture using the same mechanism. This advantageously allows the antennae located on the top of the DUT to be readily tested by the test fixture.

Figure 8:
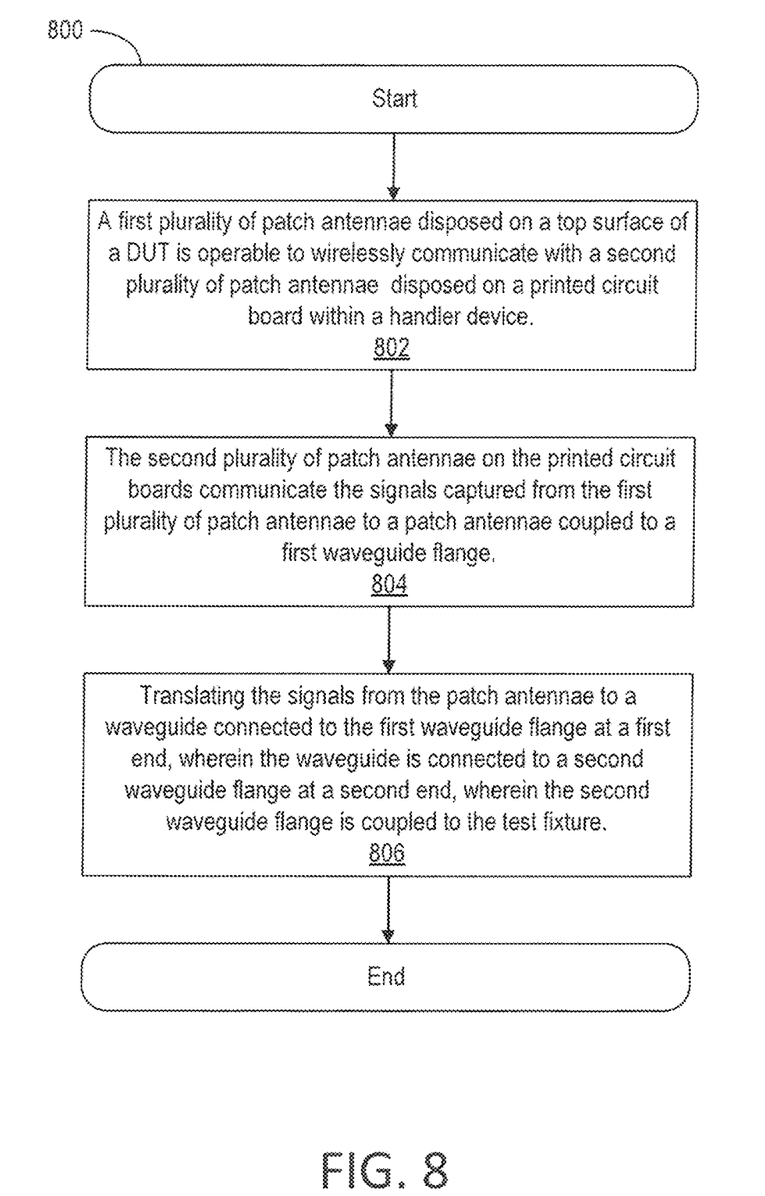
FIG. 8 is a flowchart of an exemplary method of testing a DUT comprising wireless antennae on both sides of the DUT in accordance with embodiments of the present disclosure.

FIG. 8 is a flowchart of an exemplary method of testing a DUT comprising wireless antennae on both sides of the DUT in accordance with embodiments of the present disclosure. The disclosure, however, is not limited to the description provided by flowchart 300. Rather, it will be apparent to persons skilled in the relevant art(s) from the teachings provided herein that other functional flows are within the scope and spirit of the present disclosure. Flowchart 800 will be described with continued reference to exemplary embodiments described above, though the method is not limited to those embodiments.

At step 802, a first plurality of patch antennae disposed on a top surface of a DUT are operable to wirelessly communicate with a second plurality of patch antennae disposed on a printed circuit board (or load board) within a handler device.

At step 804, the second plurality of patch antennae communicate signals captured from the first plurality of patch antennae using microstrip transmission lines to a patch antenna on the load board coupled to a first waveguide flange.

At step 806, signals are translated from the patch antenna to a waveguide connected to the first waveguide flange at a first end and connected to a second waveguide flange at a second end, wherein the second waveguide flange is coupled to the test fixture. In one embodiment, the first waveguide blind mates with a waveguide located in the test fixture to interface the signal to the tester system.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

It should also be understood, of course, that the foregoing relates to exemplary embodiments of the invention and that modifications may be made without departing from the spirit and scope of the invention as set forth in the following claims.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for testing a device under test (DUT), the method comprising:
communicating signals wirelessly from a first plurality of patch antennae disposed on a top surface of the DUT to a second plurality of patch antennae disposed on a printed circuit within a handler device, wherein the handler device is operable to place the DUT in a socket of a tester system; and
communicating the signals captured by the second plurality of patch antennae using microstrip transmission lines to a third patch antenna on the printed circuit board, wherein a first waveguide is mounted to the third patch antenna using a first waveguide flange, and wherein the first waveguide flange is coupled to a first end of the first waveguide, wherein the first waveguide is affixed to the handler device.

2. The method of claim 1, further comprising:
translating the signals to a test fixture using the first waveguide for testing, wherein the test fixture is on a bottom side of the DUT, and wherein the tester system comprises the handler device and a test fixture.

3. The method of claim 2, further comprising:
blind mating the first waveguide to a second waveguide using a second waveguide flange, wherein the second waveguide flange is coupled to a second end of the first waveguide.

4. The method of claim 3, wherein the second waveguide is located on the test fixture and interfaces the signals to the test fixture.

5. The method of claim 1, further comprising:
communicating signals wirelessly from a fourth plurality of patch antennae disposed on a bottom surface of the DUT to a fifth plurality of patch antennae disposed on a printed circuit board within the test fixture.

6. The method of claim 2, further comprising:
communicating signals wirelessly from a fourth plurality of patch antennae disposed on a bottom surface of the DUT to a horn antenna disposed within the test fixture, wherein the horn antenna captures the signals and transmits them to the test fixture.

7. A method for testing a device under test (DUT), the method comprising:
transmitting signals from a tester system to a handler device using a first waveguide, wherein the first waveguide is mounted on a single patch antenna disposed on a printed circuit board within the handler device wherein the first waveguide is affixed to the handle device;
communicating the signals from the single patch antenna to a first plurality of patch antennae on the printed circuit board using microstrip transmission lines, wherein the first plurality of patch antennae are disposed above a DUT in a socket of the tester system; and
radiating the signals wirelessly from the first plurality of patch antennae to a second plurality of patch antennae disposed on the top surface of the DUT.

8. The method of claim 7, wherein the transmitting further comprises:
blind-mating a second waveguide coupled to a test fixture to the first waveguide coupled to the handler device, wherein the tester system comprises the handler device and the test fixture and wherein the signals are transmitted to the handler device from the test fixture through the first and second waveguides.

9. The method of claim 8, further comprising:
communicating signals wirelessly from a horn antenna coupled to the test fixture to a third plurality of patch antennae disposed on a bottom surface of the DUT.

10. The method of claim 8, further comprising:
communicating signals wirelessly from a third plurality of antennae on a printed circuit board within the test fixture to a fourth plurality of patch antennae disposed on a bottom surface of the DUT.

11. A tester system for testing a device under test (DUT), the system comprising:
a handler device operable to secure and place the DUT in a socket;
a test fixture operable to receive test signals from the DUT;
a first plurality of patch antennae disposed on the top surface of the DUT operable to transmit signals wirelessly to a second plurality of patch antennae disposed on a printed circuit board within the handler device;
the printed circuit board comprising microstrip transmission lines and operable to communicate the signals to a third patch antenna using the microstrip transmission lines; and
a first waveguide mounted to the third patch antenna wherein the signals are translated to the test fixture using the first waveguide.

12. The tester system of claim 11, wherein the first waveguide is mounted to the patch antenna using a first waveguide flange, wherein the first waveguide flange is coupled to a first end of the first waveguide, and wherein the test fixture is located on an underside of the DUT.

13. The tester system of claim 12, further comprising:
a second waveguide blind mated to the first waveguide using a second waveguide flange, wherein the second waveguide flange is coupled to a second end of the first waveguide.

14. The tester system of claim 12, wherein the second waveguide connects to the test fixture at one end and to the first waveguide at the other end, and wherein the signals are carried to the test fixture from the handler device using the first waveguide and the second waveguide.

15. The tester system of claim 11, further comprising:
a horn antenna disposed in the test fixture underneath the DUT and operable to capture wireless signals transmitted from a fourth plurality of patch antennae disposed on a bottom surface of the DUT.

16. A tester system for testing a device under test (DUT), the system comprising:
a handler device operable to secure and place the DUT in a socket;
a test fixture operable to generate test signals for the DUT;
a first plurality of patch antennae disposed on the top surface of the DUT operable to receive signals wirelessly from a second plurality of patch antennae disposed on a printed circuit board within the handler device;
the printed circuit board comprising microstrip transmission lines and operable to transmit the signals from a third patch antenna on the printed circuit board to the second plurality of patch antennae using the microstrip transmission lines; and a first waveguide mounted to the third patch antenna wherein the signals are translated from the test fixture to the handler device using the first waveguide.

17. The tester system of claim 16, wherein the first waveguide is mounted to the third patch antenna using a first waveguide flange, wherein the first waveguide flange is coupled to a first end of the first waveguide, and wherein the test fixture is located below the DUT.

18. The tester system of claim 17, further comprising:
a second waveguide blind mated to the first waveguide using a second waveguide flange, wherein the second waveguide flange is coupled to a second end of the first waveguide.

19. The tester system of claim 18, wherein the second waveguide connects to the test fixture at one end and to the first waveguide at the other end, and wherein the signals are carried from the test fixture to the handler device using the first waveguide and the second waveguide.

20. The tester system of claim 16, further comprising:
a horn antenna disposed in the test fixture underneath the DUT and operable to transmit wireless signals from the test fixture to a fourth plurality of patch antennae disposed on a bottom surface of the DUT.

* * * * *